(12) United States Patent
O'Shea et al.

(10) Patent No.: US 11,018,704 B1
(45) Date of Patent: May 25, 2021

(54) MACHINE LEARNING-BASED NONLINEAR PRE-DISTORTION SYSTEM

(71) Applicant: DeepSig Inc., Arlington, VA (US)

(72) Inventors: Timothy James O'Shea, Arlington, VA (US); James Shea, Arlington, VA (US)

(73) Assignee: DeepSig Inc., Arlington, VA (US)

( * ) Notice: Subject to any disclaimer, the term of this patent is extended or adjusted under 35 U.S.C. 154(b) by 0 days.

(21) Appl. No.: 16/806,247

(22) Filed: Mar. 2, 2020

Related U.S. Application Data

(63) Continuation of application No. 15/955,485, filed on Apr. 17, 2018, now Pat. No. 10,581,469.

(60) Provisional application No. 62/486,200, filed on Apr. 17, 2017.

(51) Int. Cl.
| | |
|---|---|
| *H04B 1/04* | (2006.01) |
| *G06N 3/08* | (2006.01) |
| *G06N 3/04* | (2006.01) |
| *H04W 88/08* | (2009.01) |

(52) U.S. Cl.
CPC ............. *H04B 1/0475* (2013.01); *G06N 3/04* (2013.01); *G06N 3/08* (2013.01); *H04W 88/08* (2013.01)

(58) Field of Classification Search
CPC .......... H04B 1/0475; G06N 3/04; G06N 3/08; H04W 88/08

USPC .......................... 455/114.3, 63.1, 501, 67.13
See application file for complete search history.

(56) References Cited

U.S. PATENT DOCUMENTS

| | | | |
|---|---|---|---|
| 6,141,390 A | 10/2000 | Cova | |
| 7,289,773 B2 | 10/2007 | Braithwaite | |
| 7,372,918 B2 | 5/2008 | Muller | |
| 9,245,072 B2* | 1/2016 | Jia | ................ G06F 30/367 |
| 9,397,619 B2* | 7/2016 | Lozhkin | ................ H03F 1/3258 |
| 9,444,412 B2* | 9/2016 | Lozhkin | ................ H03G 3/3042 |
| 10,075,324 B2 | 9/2018 | Zhao | |
| 10,581,469 B1* | 3/2020 | O'Shea | ................ H04B 1/0475 |
| 2017/0257251 A1* | 9/2017 | Zhao | ................ H03F 1/3258 |

* cited by examiner

*Primary Examiner* — Ankur Jain
(74) *Attorney, Agent, or Firm* — Fish & Richardson P.C.

(57) ABSTRACT

Methods, systems, and apparatus, including computer programs encoded on computer storage media, for correcting distortion of radio signals A transmit radio signal corresponding to an output of a transmitting radio signal processing system is obtained. A pre-distorted radio signal is then generated by processing the transmit radio signal using a nonlinear pre-distortion machine learning model. The nonlinear pre-distortion machine learning model includes model parameters and at least one nonlinear function to correct radio signal distortion or interference. A transmit output radio signal is obtained by processing the pre-distorted radio signal through the transmitting radio signal processing system. The transmit output radio signal is then transmitted to one or more radio receivers.

24 Claims, 12 Drawing Sheets

US 11,018,704 B1

MACHINE LEARNING-BASED NONLINEAR PRE-DISTORTION SYSTEM

CROSS-REFERENCE TO RELATED APPLICATION

This application is a continuation of U.S. application Ser. No. 15/955,485, filed Apr. 17, 2018, now allowed, which claims priority to U.S. provisional application No. 62/486,200, filed on Apr. 17, 2017. The disclosures of these prior applications are considered part of and are incorporated by reference in the disclosure of this application.

TECHNICAL FIELD

This specification relates to integrating nonlinear pre-distortion machine learning into radio communication systems to correct for radio signal distortion and interference.

BACKGROUND

Radio communication systems include transmitting radio signal processing systems and receiving systems as well as various sources, e.g., amplifiers, which distort or interfere with radio signals being communicated by the transmitters to the receivers. This distortion or interference can alter, modify, or disrupt signal waveforms between transmission and reception.

A machine learning model receives input and generates output based on its received input and on values of model parameters.

Neural networks are machine learning models that employ one or more layers of nonlinear units to predict an output for a received input. Some neural networks include one or more hidden layers in addition to an output layer. The output of each hidden layer is used as input to other layers in the network, e.g., the next hidden layer or the output layer. Each layer of the network generates an output from a received input in accordance with current values of a respective set of parameters. These neural networks can be trained to generate predicted output.

SUMMARY

This specification describes technologies for machine learning systems in general, and specifically to systems and methods for pre-distorting radio signals of radio communication systems using a nonlinear pre-distortion machine learning model.

In general, one innovative aspect of the subject matter described in this specification can be embodied in methods that include the actions of correcting distortion or interference of radio signals. Other embodiments of this aspect include corresponding computer systems, apparatus, and computer programs recorded on one or more computer storage devices, each configured to perform the actions of the methods. For a system of one or more processors to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions The foregoing and other embodiments can each optionally include one or more of the following features, alone or in combination. In particular, one embodiment includes all the following features in combination.

A transmit radio signal that corresponds to an output of a transmitting radio signal processing system is obtained. A pre-distorted radio signal is generated by processing the transmit radio signal using a nonlinear pre-distortion machine learning model. The nonlinear pre-distortion machine learning model includes model parameters and at least one nonlinear function to correct radio signal distortion and/or interference. A transmit output radio signal is obtained by processing the pre-distorted radio signal through the transmitting radio signal processing system. The transmit output radio signal is then transmitted to one or more radio receivers.

In some implementations, the model parameters are updated with values for a particular deployment scenario for a radio communication system upon initial deployment of the nonlinear pre-distortion machine learning model into the radio communication system.

In some implementations, a signal may be received from one or more radio receivers corresponding to the transmit output radio signal that was transmitted to the one or more radio receivers.

In some implementations, the model parameters are updated based on a distance metric computed between the transmit radio signal corresponding to output of a transmitting radio signal processing system and the received signal of the one or more radio receivers. The model parameters can additionally or alternatively be updated through a management process to minimize a distance metric or depending on at least one environment condition within the radio communication system.

An environment condition may be: temperature, humidity, antenna impedance, power levels, or candidate transmit signal type.

The particular deployment scenarios may be one or: sending a radio transmission from a cellular base station that includes the nonlinear pre-distortion machine learning model inside a tower mounted amplifier in an inline mode; sending a radio transmission from a cellular base station that includes the nonlinear pre-distortion machine learning model inside a tower mounted amplifier in a fault-tolerant subtractive mode; sending a radio transmission from a cellular base station that includes the nonlinear pre-distortion machine learning model inside a remote radio unit in an inline mode; sending a radio transmission from a cellular base station that includes the nonlinear pre-distortion machine learning model inside a remote radio unit in a fault-tolerant subtractive mode; sending a radio transmission to a mobile handheld device that includes the nonlinear pre-distortion machine learning model, which obtains model parameter updates off a hardware chip and provides pre-distorted signals on the hardware chip or off the hardware chip; sending a radio transmission to a mobile handheld device that includes the nonlinear pre-distortion machine learning model, which obtains model parameter updates on-chip and provides pre-distorted signals on a hardware chip; sending a radio transmission to a backhaul or satellite relay radio system and using feedback from one or more amplifiers to determine model parameters of the nonlinear pre-distortion machine learning model; or sending radio transmission to a system that includes interference cancellation.

Correcting distortion of radio signals may include correcting interference of radio signals.

In some implementations, in order to train a nonlinear pre-distortion model to correct distortion of radio signals, a candidate transmit radio signal corresponding to output of a transmitting radio signal processing system may be obtained. The candidate transmit radio signal is processed using a nonlinear pre-distortion machine learning model that executes using a set of model parameters to generate a pre-distorted candidate transmit radio signal. The nonlinear pre-distortion machine learning model includes at least one nonlinear function to correct one or more of radio signal distortion or interference. A received radio signal corresponding to input of a radio receiver is obtained by processing the pre-distorted candidate transmit radio signal using one or more sources of distortion or interference. A distance metric is computed between the candidate transmit radio signal and the received radio signal. Updated values for the set of model parameters of the nonlinear pre-distortion machine learning model are determined that minimize the distance metric computed between the candidate transmit radio signal and the received radio signal to correct for one or more sources of alteration of the candidate transmit radio signal in the transmitting radio signal processing system. The values of the set of model parameters of the nonlinear pre-distortion machine learning model are updated in order to train the nonlinear pre-distortion machine learning model.

The model parameters are initially either randomly chosen or are seeded from a random distribution. The model parameters can be optimized through a model optimization process to minimize radio signal distortion or interference.

In some implementations, the distance metric is selected from one of: a mean squared error, absolute error, or computed between the candidate transmit radio signal and the received radio signal to form a quantitative measurement of an error value. A type of model chosen for the nonlinear pre-distortion machine learning model may be updated in addition to updating the values of the set of model parameters of the nonlinear pre-distortion machine learning model using the model optimization process.

In some implementations, the initial values for the model parameters are computed using a distance metric in a pre-deployment environment for a specific device or type of device. The candidate transmit radio signal may meet a desired use case for a particular deployment scenario.

The distance metric between the candidate transmit radio signal and the received radio signal may minimize cross-entropy towards a non-distorted target of a secondary trained classifier network trained to classify loss between a distorted and a non-distorted signal. The received radio signal may be received after a wireless transmission from an antenna, or after a relay system receivers, amplifiers, and retransmits the pre-distorted candidate transmit radio signal.

The nonlinear pre-distortion machine learning model may be a deep neural network, a convolutional neural network, a convolutional neural network, a recurrent neural network, or a combination of different types of neural networks.

Determining updated values for the model parameters may include using Stochastic Gradient Descent style optimizers that iteratively minimize the distance metric based on an exact or approximate gradient of the distance metric with regard to the model parameters.

Another implementation comprising one or more processors and one or more storage devices storing instructions that are operable, when executed the on one or more processors, to cause the one or more processors to perform any of the above implementations.

Still another implementation may be one or more non-transitory computer-readable storage mediums comprising instructions stored thereon that are executable by a processing device and upon such execution cause the processing device to perform any of the above implementations.

The subject matter described in this specification can be implemented in particular embodiments so as to realize one or more of the following advantages.

In conventional radio communication systems, in order to obtain acceptable linear modulation performance or minimally distorted or interference-free output, amplifiers are carefully designed for linearity and operated at non-maximal output powers (e.g., before severe compression), limiting the amplifiers efficiency for fidelity and leading to expensive design and parts. Operating amplifiers at non-maximal output in more linear regions can significantly increase cost and power consumption.

A radio communication system with an integrated nonlinear pre-distortion machine learning model as disclosed herein can minimize interference and distortion while operating amplifiers at maximal or near maximal output power levels. The system has a greater capacity for removing interference and correcting distortion than traditional systems and achieves greater linearity. Further, the system can accurately correct for distortion and interference due to non-linear effects within the system. The system can also model and suppress interference occurring over large time delays and large bandwidths of input signals. The system is also able to be realized in a computationally efficient form requiring smaller data types and more concurrent operations at lower clock speeds which lead to reduced power consumption and computational requirements when compared with existing digital pre-distortion methods (e.g. polynomial models or otherwise).

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification generally describes a radio communication system, integrated with a nonlinear pre-distortion machine learning model to correct for radio signal distortions and interferences.

For example, a machine learning model may be trained to predict a pre-distorted radio signal for a given transmit radio signal that minimizes a distance metric between the transmit radio signal that is transmitted from a transmit radio processing system and a received radio signal that is received by a receiver.

Figure 1:
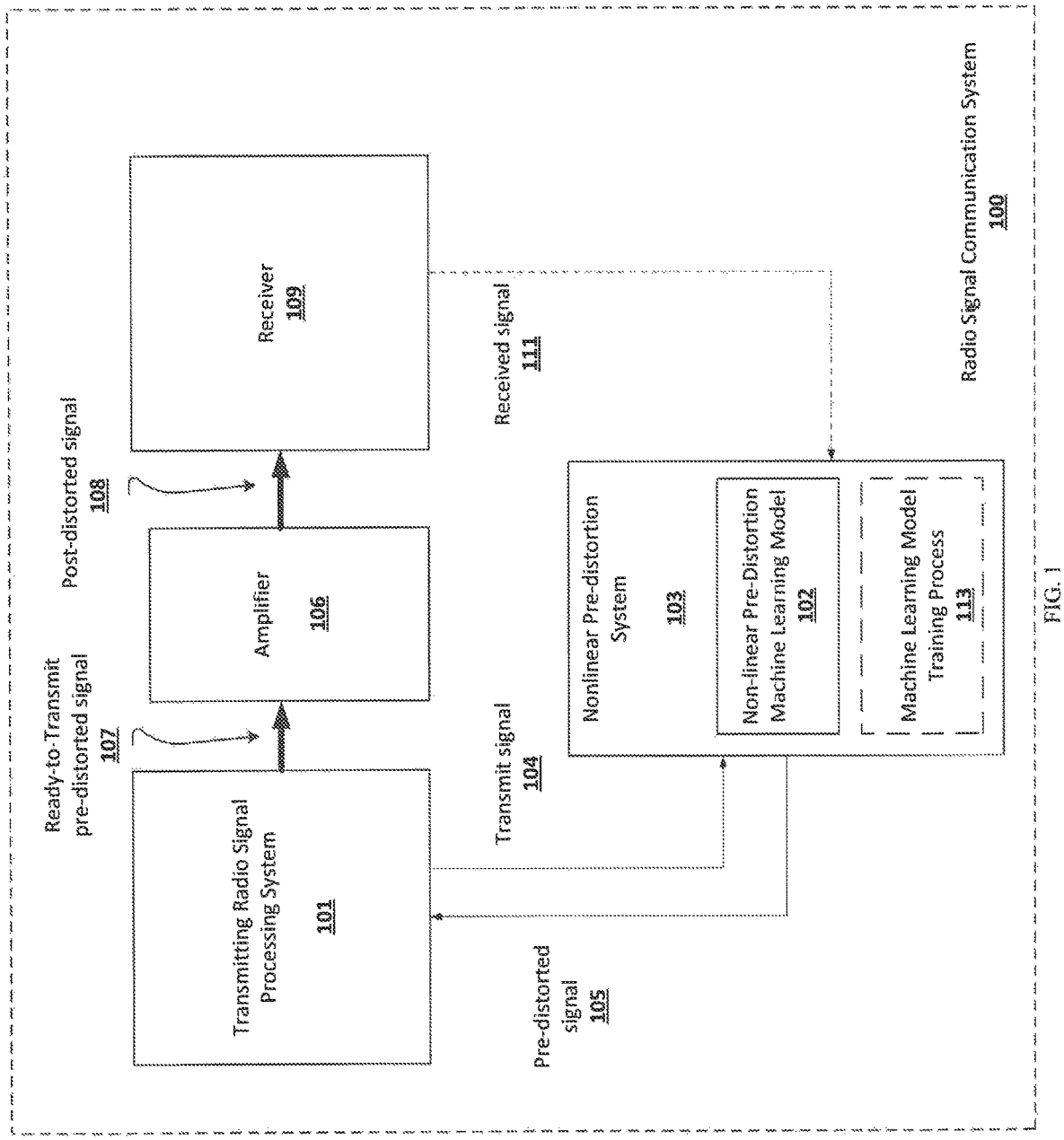
FIG. 1 is an overall system diagram that shows an example radio communication system with an integrated nonlinear pre-distortion system operation for correcting radio signal distortions and interferences.

FIG. 1 illustrates an example radio communication system 100 with an integrated nonlinear pre-distortion system for correcting radio signal distortions and interferences. Within the radio communication system 100, a transmitting radio signal processing system 101 transmits radio signals to a receiver 109. In the transmission process, one or more components, e.g., an amplifier 108, of the radio communication system 100 may distort or interfere with the radio signals to be transmitted to a receiver 109. The radio communication system 100 may have multiple sources of distortion and/or interference.

For example, the radio communication system 100 may include at least one radio frequency (RF) power amplifier 106 that amplifies radio signals but also distorts signal waveforms. As illustrated, the amplifier 106 is separate from the transmitting radio signal processing system 101. However, in some implementations the amplifier can be tightly integrated (e.g., within a handset) or loosely coupled (e.g., a tower mounted amplifier) within the transmitting radio signal processing system 101.

Signal interference may occur when the radio communication system 100 experiences large time delays or transmits large bandwidths of data streams that include the radio signals. Other sources of distortion or interference include reflectors; bad connectors; imperfections in the digital to analog conversion process; unintended coupling, impedance mismatch or emissions for other electronics; unintended tones, intermodulation products or sidelobes; responses from other analog electronic components such as filters, power supplies, matching networks, junctions, attenuators, and mixers. The radio communication system 100 uses a nonlinear pre-distortion system 103 to correct the radio signal distortion and interference prior to the radio signals being transmitted to the receiver 109.

As shown in FIG. 1, the nonlinear pre-distortion system 103 uses a nonlinear pre-distortion machine learning model 102 to determine pre-distorted radio signals that minimize a distance between the radio signals that the transmitting radio signal processing system 107 transmits and radio signals the receiver receives 108. The machine learning model 102 takes a transmit radio signal 104 as input and generates a pre-distorted signal 105 as output. The machine learning model 102 is described in more detail below with respect to FIG. 3.

The nonlinear pre-distortion system 103 of FIG. 1 includes both a non-linear pre-distortion machine learning model 102 and a machine learning model training process 113. The machine learning model training process 113 trains the machine learning model to minimize a distance between the transmitted radio signals and the received signals.

In some implementations, only the nonlinear pre-distortion machine learning model 102 is deployed within the radio communication system 100. In this implementation, the machine learning model 102 is trained on one or more of real and simulated data prior to deployment.

In other implementations, the nonlinear pre-distortion system 103 is deployed in the radio signal communication system in order for the nonlinear pre-distortion system 103 to perform online tuning and continue to train and update model parameters during real time execution. In this implementation, the machine learning model training process 113 receives the received signal 111, which includes both the pre-distortion and the distortion effects, from the receiver to determine real time online tuning and model parameter updates. This process can continue to compensate for changes in the response of a specific amplifier device over its lifetime and through changes in environmental conditions or signal loading conditions. The machine learning training process 113 is described in more detail below, with respect to FIG. 4.

Figure 2:
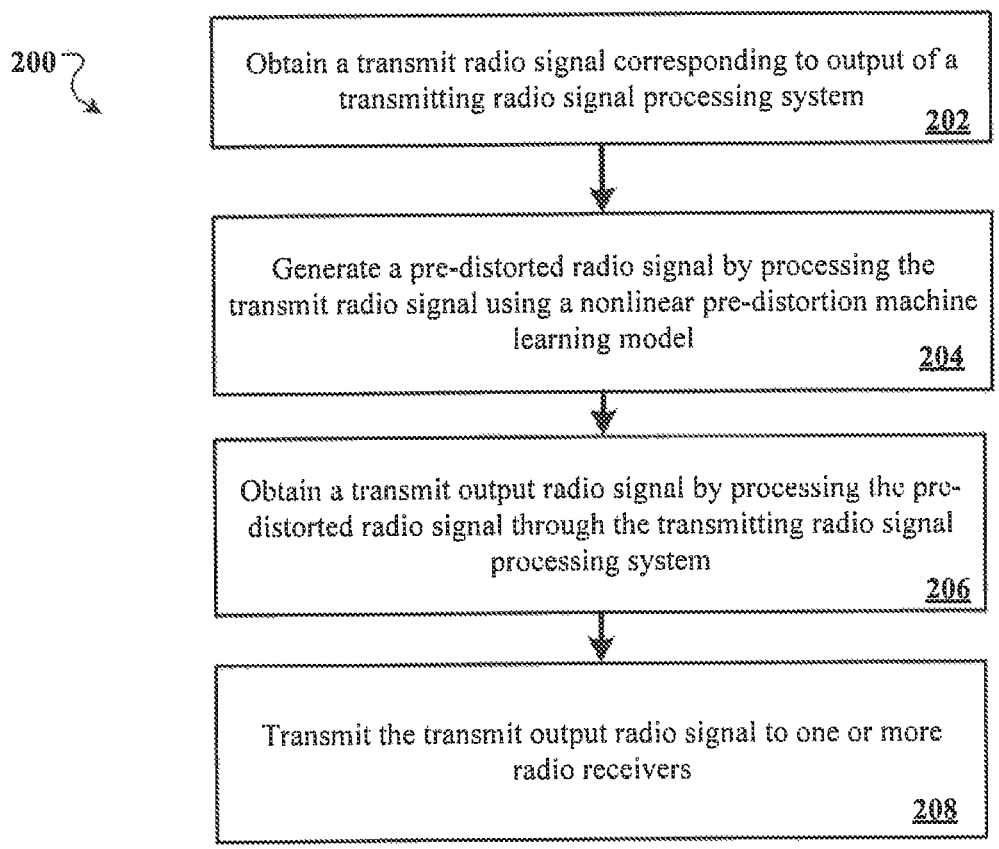
FIG. 2 illustrates an example flow diagram of an example process for correcting radio signal distortions and interferences within a radio communication system.

FIG. 2 illustrates a flow diagram of an example process for correcting radio signal distortions and interferences within a radio communication system. The process 200 can be performed by a system of one or more computing devices, located in one or more locations, and programmed appropriately in accordance with this specification. For example, the radio communication system 100 of FIG. 1, appropriately programmed, can perform process 200.

As illustrated in FIG. 2, to correct radio signal distortion and interference, the system obtains a transmit radio signal corresponding to output of a transmitting radio signal processing system 202. In some examples, the system may use a model execution controller to transmit the transmit radio signal, for example to control or track the state of the transmitting software or to control or track a mode of the pre-distortion model. Examples of mode may be GSM, LTE, HSPA, or different bandwidths of LTE (e.g., 5 MHz, 10 MHz, 20 MHz), or different numbers of aggregated LTE carriers 3×20 MHz. The state may include how loaded the system is, whether the system is completely filled with traffic, whether the system has idle or unoccupied resource blocks. The transmit radio signal is transmitted from the transmit radio signal system to the nonlinear pre-distortion machine learning model.

The system then generates a pre-distorted radio signal by processing the transmit radio signal using the nonlinear pre-distortion machine learning model 204.

Figure 3:
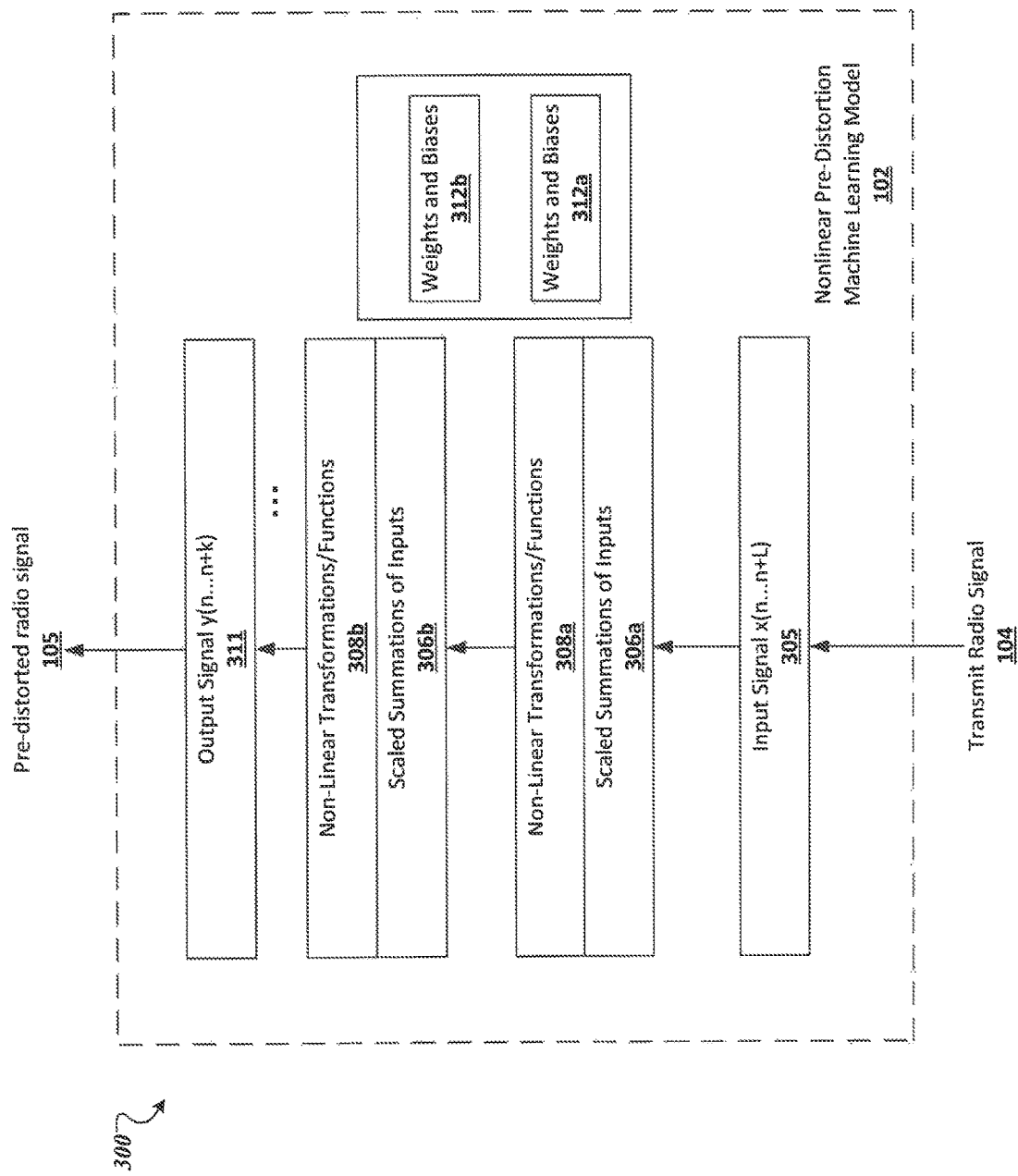
FIG. 3 illustrates the functionality of an example nonlinear pre-distortion machine learning model.

Referring to FIG. 3, the nonlinear pre-distortion machine learning model 102 may be a neural network, e.g., a deep neural network, a convolutional neural network, a recurrent neural network, or a combination of any of these types of neural networks. Neural networks are machine learning models that employ one or more layers of neurons to generate an output, e.g., one or more classifications, for a received input. Deep neural networks include one or more hidden layers in addition to an output layer. The output of each hidden layer is used as input to other layers in the network, i.e., another next hidden layer or the output layer. Each layer of the neural network generates an output from a received input in accordance with current values of a respective set of parameters (weights 312) for the layer. These neural networks may be trained as a generative adversarial network, where multiple objectives such as generation (e.g. generating one signal from another signal) and classification (e.g. determining a distorted signal from a non-distorted signal) are jointly or iteratively optimized between two or more tightly coupled networks. These neural networks may also be trained using autoencoders, wherein a network may be trained to produce a reconstruction of a signal through an intermediate representation of the signal (e.g. a smaller or otherwise constrained latent version of the signal, which can be used to retain key structural components of the signal). Neural networks may also employ residual units, skip connections, or similar whereby connections from one layer to another may find various paths throughout the network, providing representation capabilities beyond more traditional sequential neural network models which always feed from one layer to its direct successor. The neural network model may be selected from a plurality of possible model architectures (e.g. connections, layer sizes, hyper-parameter settings) based on an automated search process during the training phase in order to optimize performance.

As illustrated, the machine learning model 102 takes in one or more transmit radio signals 104 as input. The input signals 305 and input values to other layers are combined using multiplications with weight vectors 312 and accumulates/summations of these products along with bias vectors along with other operations such as batch normalization, dropout, exponentiation, or otherwise which operate on activations to produce. The weight vectors are multiplied with neuron layer inputs, while bias vectors are added with the products of these summations (e.g., out=activation (in0*w0+in1*w1+b0)). The weight vectors of all the layers as well as other parameters including bias vectors are referred to as model parameters.

The results of the multiplications and accumulations 306 form outputs that are passed through nonlinear transform functions 308. The transformation functions can be one or more of linear, sigmoid, exponential, hyperbolic tangent, rectified linear (ReLU), leaky-ReLU, or one of many other potential forms of nonlinear activation function that works optimally to minimize a distance metric or loss function. The output signals 308 are combined to produce a pre-distorted radio signal 105 as model output. This output may be comprised of In-phase and Quadrature (I/Q) time domain samples which can be converted to a complex or real analog signal.

Referring back to FIG. 2, after generating a pre-distorted radio signal from the nonlinear pre-distortion machine learning model, the system obtains a transmit output radio signal by processing the pre-distorted radio signal through the transmitting radio signal processing system 206. For example, the transmitting radio signal processing system may appropriately tune, scale or modify the pre-distorted radio signal, or it may compute a difference signal between the pre-distorted signal and the input signal (e.g. for subtractive pre-distortion). The system converts the signal to an analog signal by a digital to analog converter. Once the signal has been converted, the generated signal may be considered a transmit output radio signal that is ready to transmit, or in the case of a difference signal may be additively combined with the original signal using an analog signal summation device.

The system then transmits the transmit output signal to one or more radio receivers 208. The transmit output signal can be transmitted through a target hardware amplifier device that introduces distortions and/or interference into the signal. The transmit output signal may also be transmitted through an antenna. The signal is then usually converted back into a digital signal using an analog to digital converter to form a signal that can be processed within the digital processor of the remote receivers. This received signal includes both the pre-distortion and the distortion effects, which in ideal circumstances combine to form a highly linear and ideal signal over the air which accurately reflects the modulation basis of the transmitting system (e.g. an OFDM or SC-FDMA modulator which might be used in a cellular transceiver).

In order to provide pre-distorted signals, a system trains the nonlinear pre-distortion machine learning model to predict pre-distorted signals based on given input. Referring to FIG. 1, the machine learning training process 113 can train the machine learning model 102 in simulation or on real radio communication systems to predict pre-distorted signals that minimize a distance metric.

Figure 4:
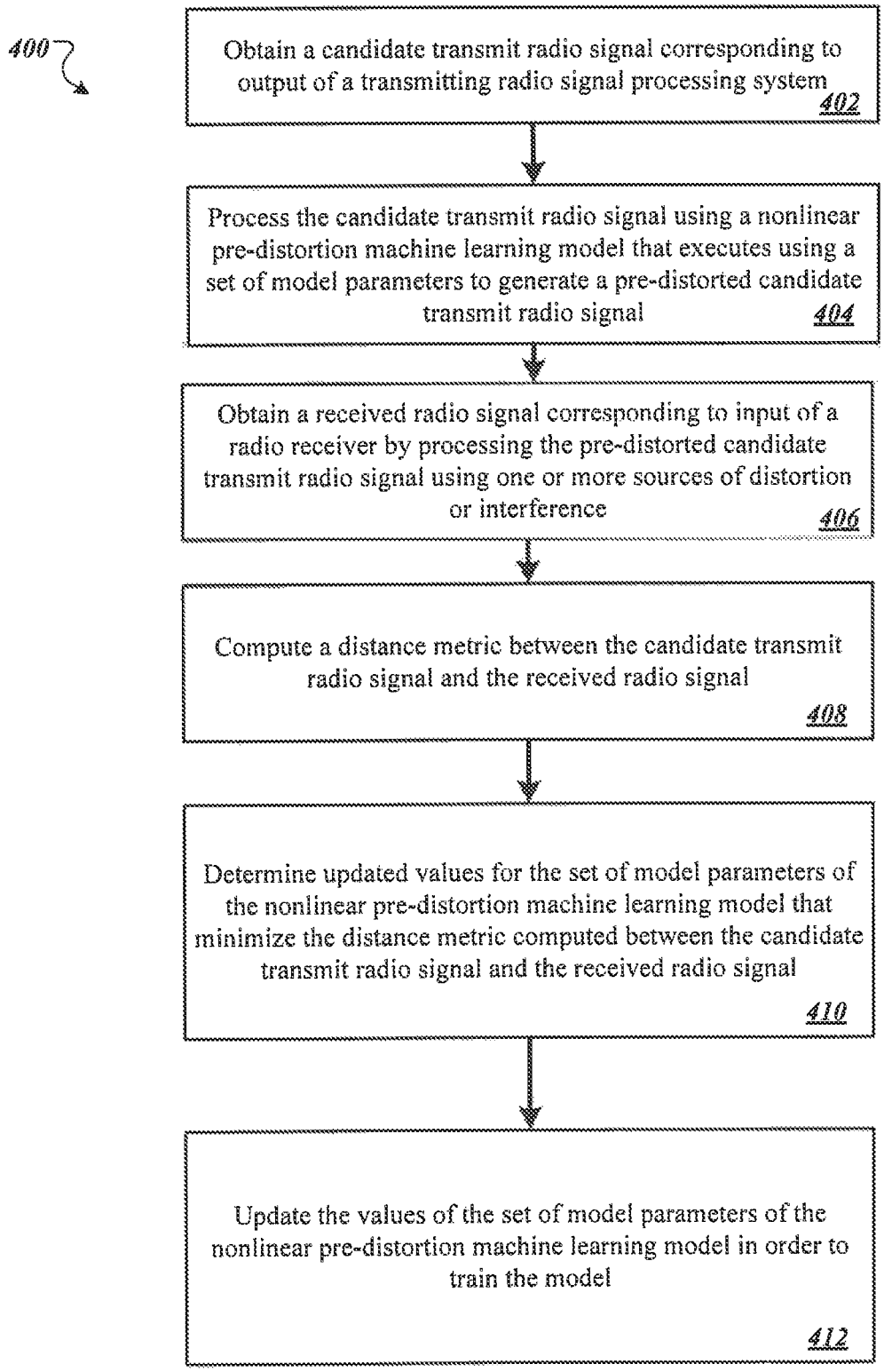
FIG. 4 illustrates a flow diagram of an example process for training a nonlinear pre-distortion machine learning model to determine pre-distorted radio signals that correct distortions and interferences of a radio communication system.

FIG. 4 illustrates a flow diagram of an example process 400 for training a nonlinear pre-distortion machine learning model to correct distortion and interference. The process 400 can be performed by a system of one or more computing devices, located in one or more locations and programmed appropriately in accordance with this specification. For example, the nonlinear pre-distortion system 103 of FIG. 1, appropriately programmed, can perform process 400.

To train the machine learning model, the system initializes values of a set of parameters for the machine learning model. The values can be initially randomly chosen or seeded from a random distribution. The model may have a fixed model architecture defining the node types and connections, which may be chosen from among a plurality of model architectures based on multiple training processes and comparison of distance metrics. The initial parameters may also be chosen for a specific device or type of devices in a pre-deployment environment or based on devices or types of devices expected in a deployment environment in which the machine learning model will be deployed, in this case the parameters may be taken from another similar model.

The system obtains a candidate transmit radio signal corresponding to output of a transmitting radio signal processing system 402. A model execution controller can control the transmission of the candidate transmit waveforms that meet desired use cases of target amplifiers and waveforms for a deployment scenario for which the machine learning model is being trained. For example, the candidate transmit waveforms may reflect the radio signals that would be transmitted in a target deployed radio communication system, such as an LTE base station signal, a point-to-point microwave or mm-wave backhaul signal, in this way the training process can train on one or more modes of a representative set of protocols and transmission modes and conditions similar to those which will occurring in operation.

The system then processes the candidate transmit radio signal using the nonlinear pre-distortion machine learning model that executes using the set of model parameters to generate a pre-distorted candidate transmit radio signal 404.

The system obtains a received radio signal corresponding to input of a radio receiver by processing the pre-distorted candidate transmit radio signal using one or more sources of distortion or interference 406. Other sources of distortion or interference include reflectors; and bad connectors; imperfections in the digital to analog conversion process; unintended coupling, impedance mismatch or emissions for other electronics; unintended tones, intermodulation products or sidelobes; responses from other analog electronic components such as filters, power supplies, matching networks, junctions, attenuators, mixers, etc.

The system computes a distance metric between the candidate transmit radio signal and the received radio signal

408. The distance metric is selected from one of several options including: a mean squared error, an absolute error, or some other computation between the transmit radio signal and the received radio signal to form a quantitative measurement of the error vector. The distance metric between the candidate transmit radio signal and the received radio signal may be to minimize cross-entropy towards a non-distorted target of a secondary trained classifier network trained to classify loss between a distorted and a non-distorted signal (e.g. an adversarial network)

The system determines updated values for the set of model parameters of that minimize the distance metric computed between the candidate transmit radio signal and the received radio signal 410.

In some implementations, the system iterates over multiple candidate transmit radio signals that correspond to various potential deployment scenarios of the radio communication system to continually reduce the distance metric computed between the transmitted and received radio signals. The system may perform training using many sequential samples in a transmit waveform to encapsulate long-temporal distortion effects in addition to short-time distortion effects. For instance, the process of distorting memory effects within amplifier devices may operate on multiple timescales such as nano-second and micro-second scale effects, while a processing for cancellation of delayed artifacts of the primary signal may need to operate to remove effects a single sample away, or hundreds or more of samples away, depending on the rate of the sampling, the temporal scale of the distortions, and the pre-distortion model architecture.

In some implementations, the error value or loss value corresponding to the distance metric is used to guide model selection (e.g. by training and evaluating a plurality of possible model architectures and selecting those with lower distance metrics for further evaluation or usage).

Figure 5A:
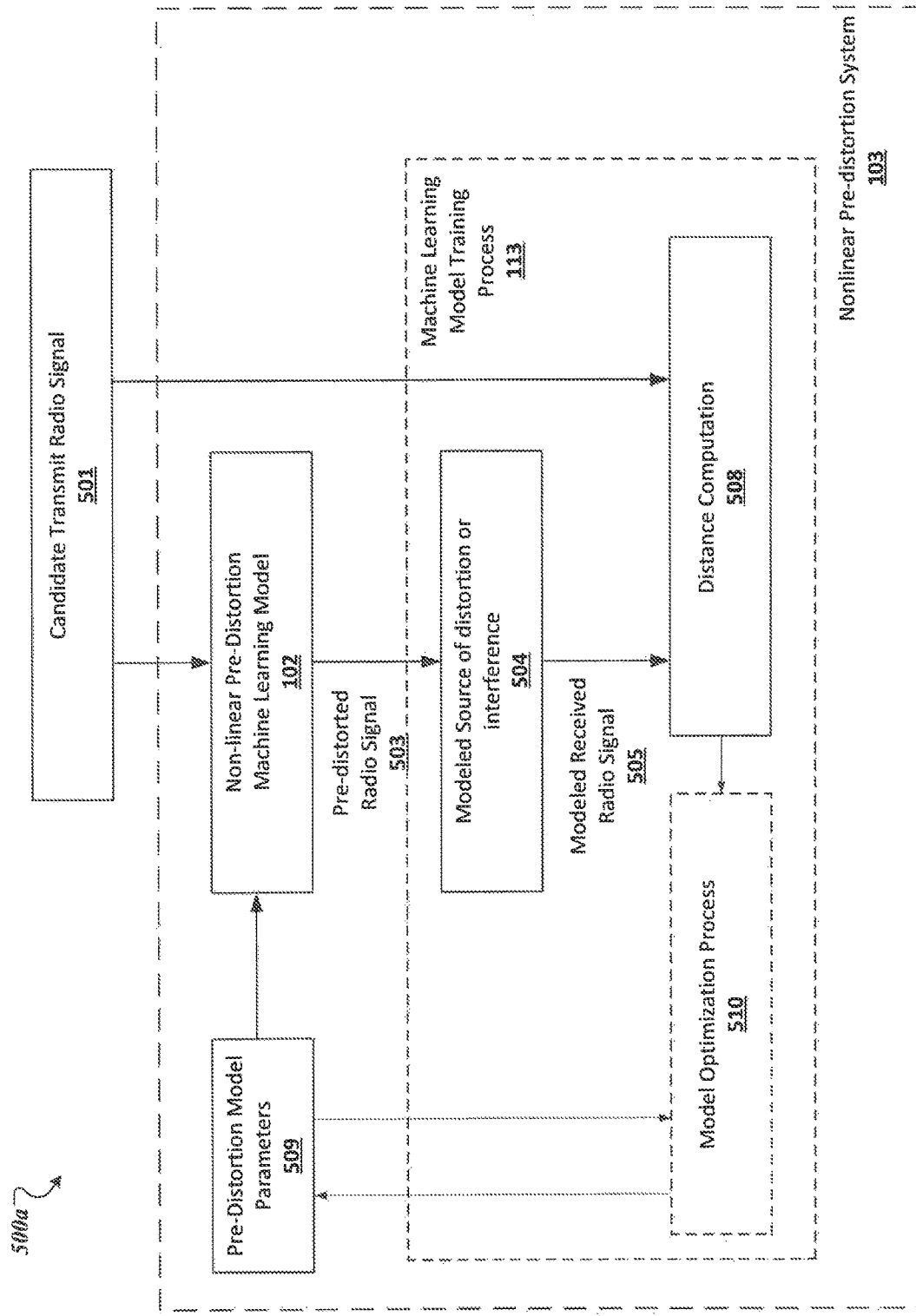
FIG. 5A illustrates an example configuration of a nonlinear pre-distortion system for model training.

FIG. 5A illustrates an example configuration of a nonlinear pre-distortion system for model training. In some implementations, the nonlinear pre-distortion system 500*a* is the same as the nonlinear pre-distortion system 103. The nonlinear pre-distortion machine learning model in configuration 500*a* provides a pre-distorted radio signal 503 to a modeled source of distortion or interference 504. The distortion or interference source produces a modeled received radio signal 505 that can be used by a distance computation process 508 to compute a distance metric between the candidate transmit radio signal 501 and the modeled received radio signal 505. The system then sends the computed distance metric to a model optimization process 510. This process determines updated parameters for the machine learning model that minimize the distance metric. The goal of the optimization process is to provide parameters that will allow the radio communication system to have the best performance, e.g., the least distorted signals. The system updates model values using Stochastic Gradient Descent-style optimizers, e.g. Adam, AdaGrad, or Nesterov Stochastic Gradient Descent, to help iteratively minimize the distance metric based on an exact or approximate gradient of the distance metric with regard to the model parameters. In some implementations, the model optimization process selects optimal models to use as the nonlinear pre-distortion machine learning model 103 in addition to determining updated parameters for a model, for example by selecting models which achieve best model performance from a plurality of models through a search process.

Figure 5B:
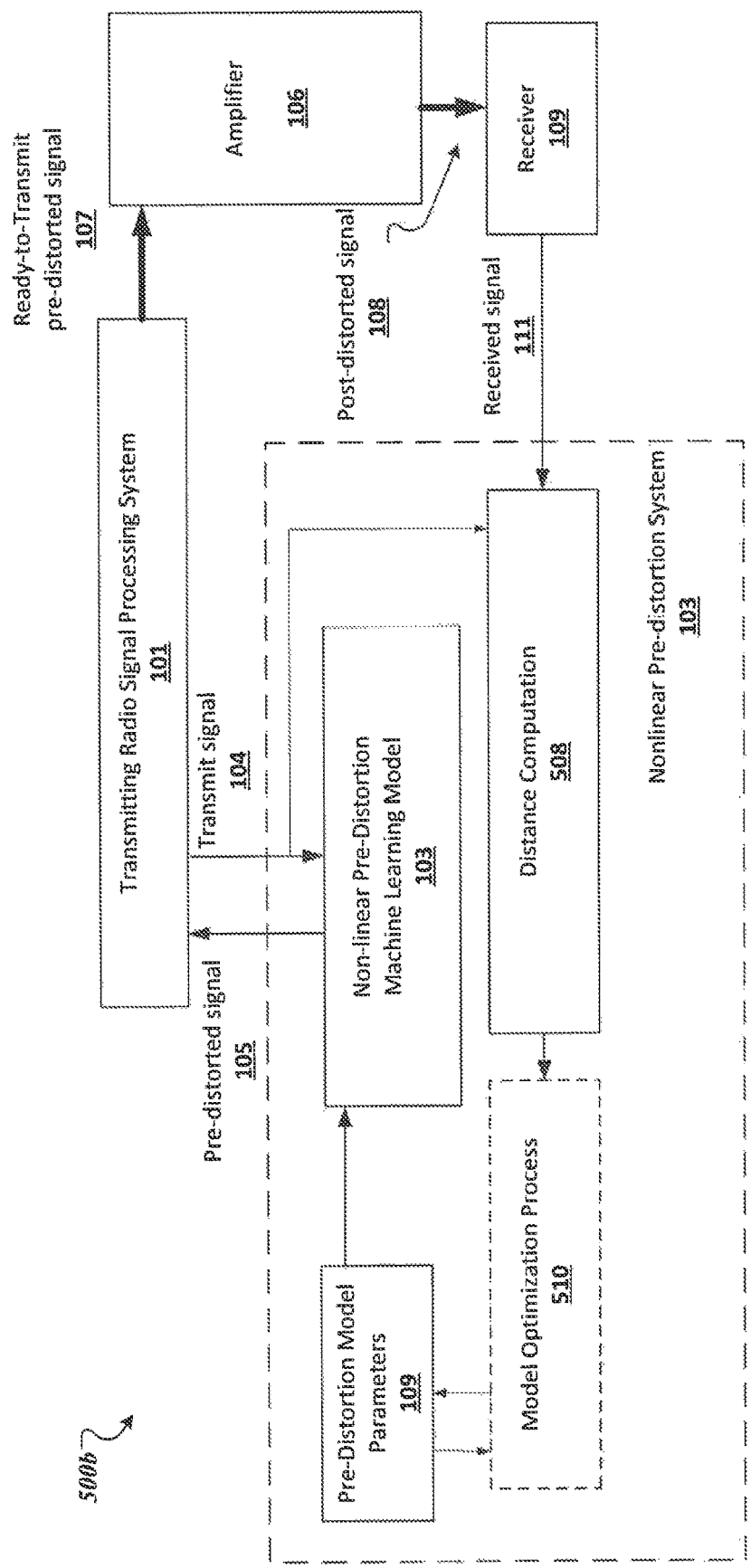
FIG. 5B illustrates an example configuration of a nonlinear pre-distortion system for online model tuning.

FIG. 5B illustrates an example configuration of a nonlinear pre-distortion system for online model tuning. In some implementations, the nonlinear pre-distortion system 500*a* is the same as the nonlinear pre-distortion system 103. In FIG. 5B, the nonlinear pre-distortion machine learning model in configuration 500*b* is deployed in a real-time execution environment. A transmitting radio signal processing system 101 provides actual transmit signals 104 to the nonlinear pre-distortion machine learning model 103. The model provides pre-distorted signals 105 that the transmitting radio signal processing system 101 processes as described above to obtain a ready-to-transmit pre-distorted signal 107. In some implementations, an amplifier 106 amplifies the signal to generate a post-distorted signal 108 that is received by a receiver 109. In other implementations, the receiver 109 may amplify and retransmit the signal. In the online tuning configuration, the receiver 109 sends the received signal 111 to the nonlinear pre-distortion system in order for the system to compute the distance metric between the transmit signal 104 and the received signal 111. The model optimization process 510 then computes updated pre-distortion model parameters 109 for the nonlinear pre-distortion machine learning model 103 in order to minimize the distance metric. This processing continually updates the parameters during real time execution to tune the model.

In addition to training and model tuning, the nonlinear pre-distortion system can include a management process for managing model parameter updates. These updates can be based on a pre-deployment environment or a deployment environment within a radio communication system in which a nonlinear pre-distorted machine learning model is deployed. Environment conditions can include temperature, humidity, antenna impedance, power levels, or candidate transmit signal type.

Figure 6A:
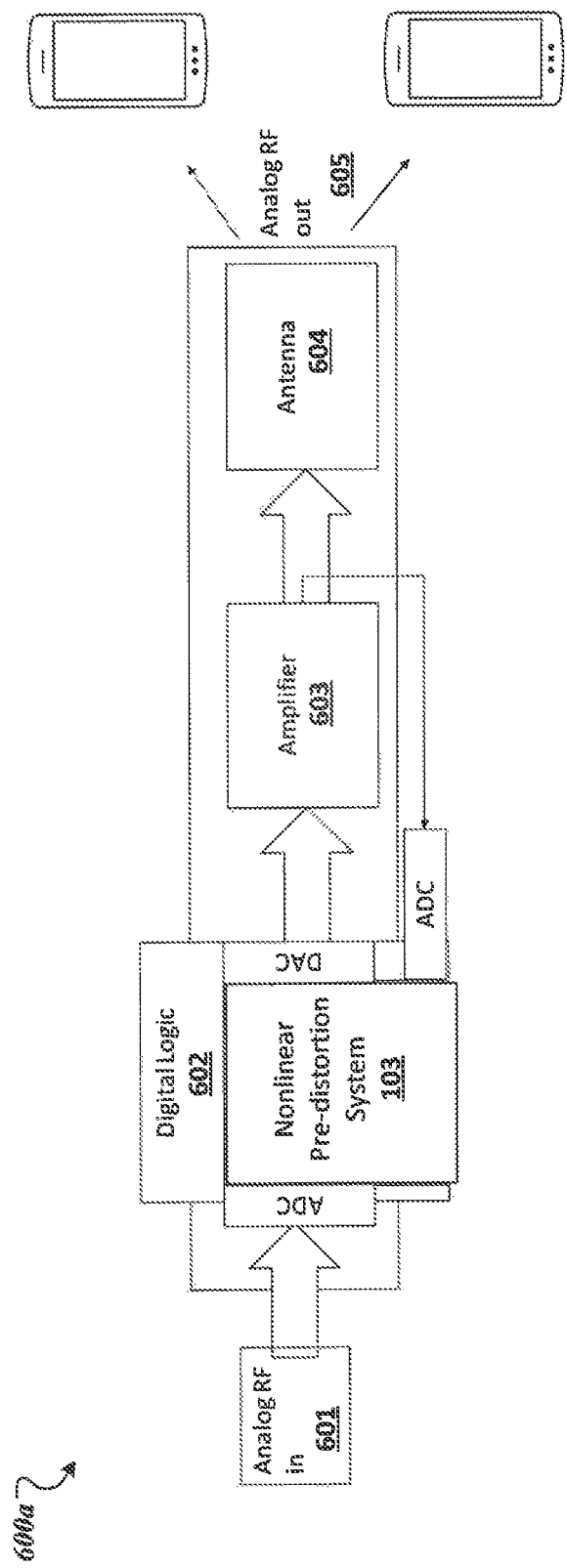
FIG. 6A illustrates an example configuration for in-line mode within a tower-mounted amplifier.
Figure 6B:
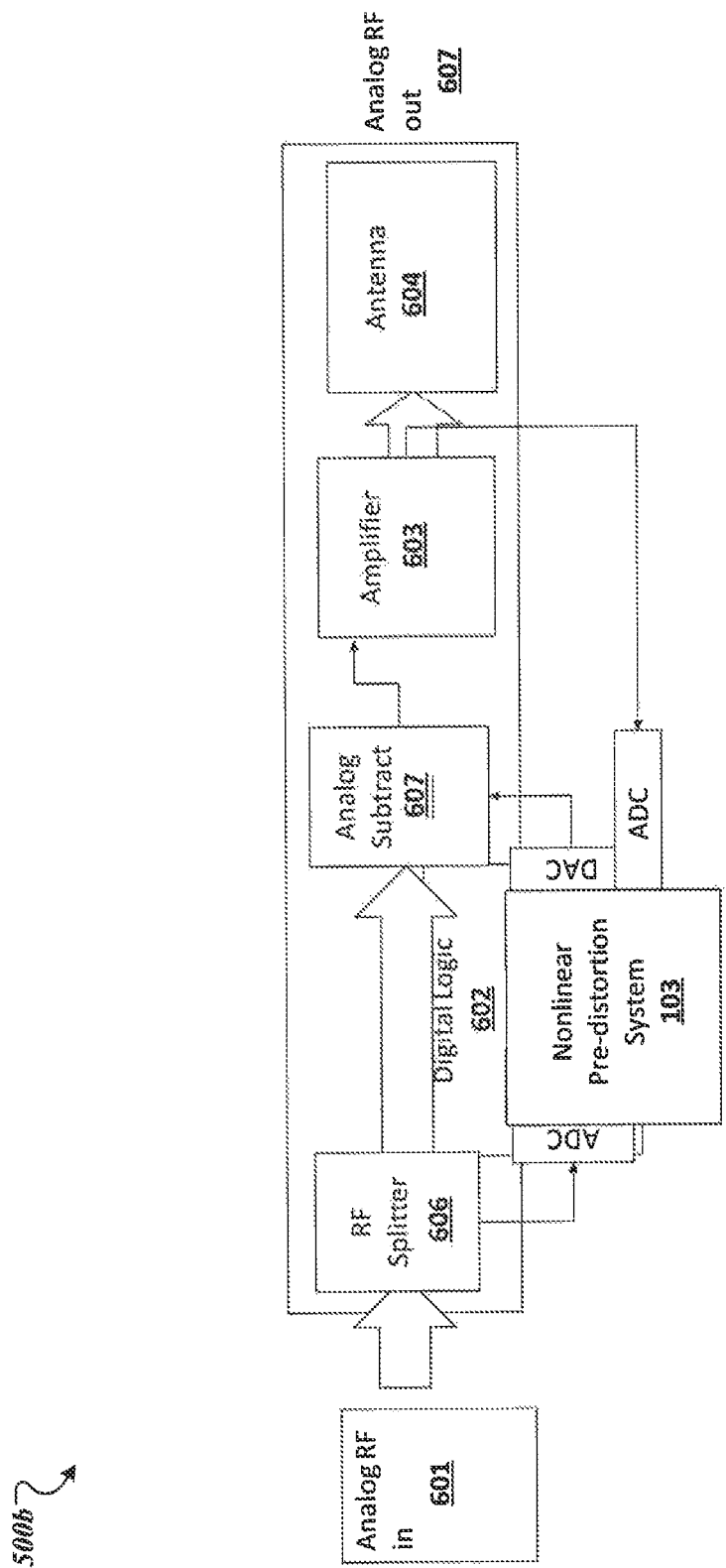
FIG. 6B illustrates an example configuration for fault-tolerant subtractive mode within the tower-mounted amplifier.
Figure 7A:
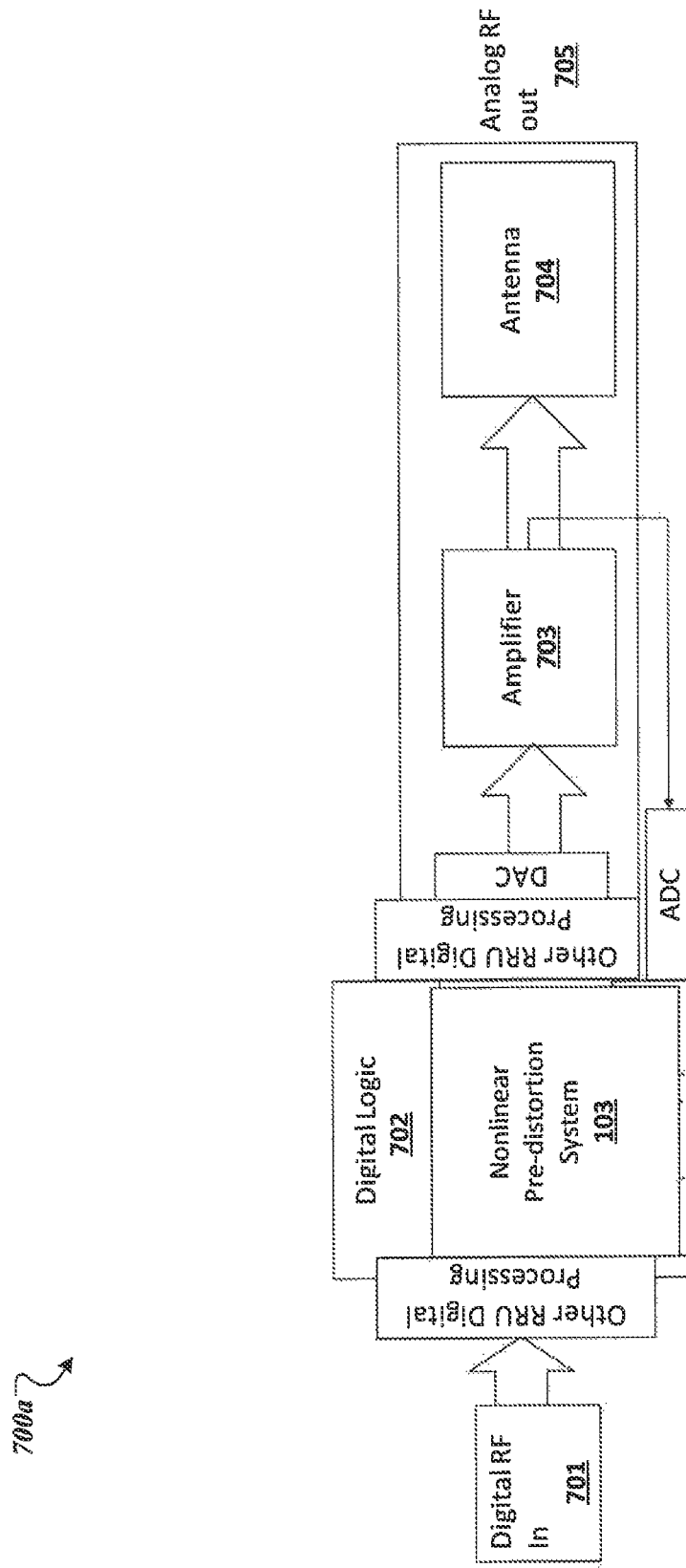
FIG. 7A illustrates an example configuration for in-line mode within a remote radio unit.
Figure 7B:
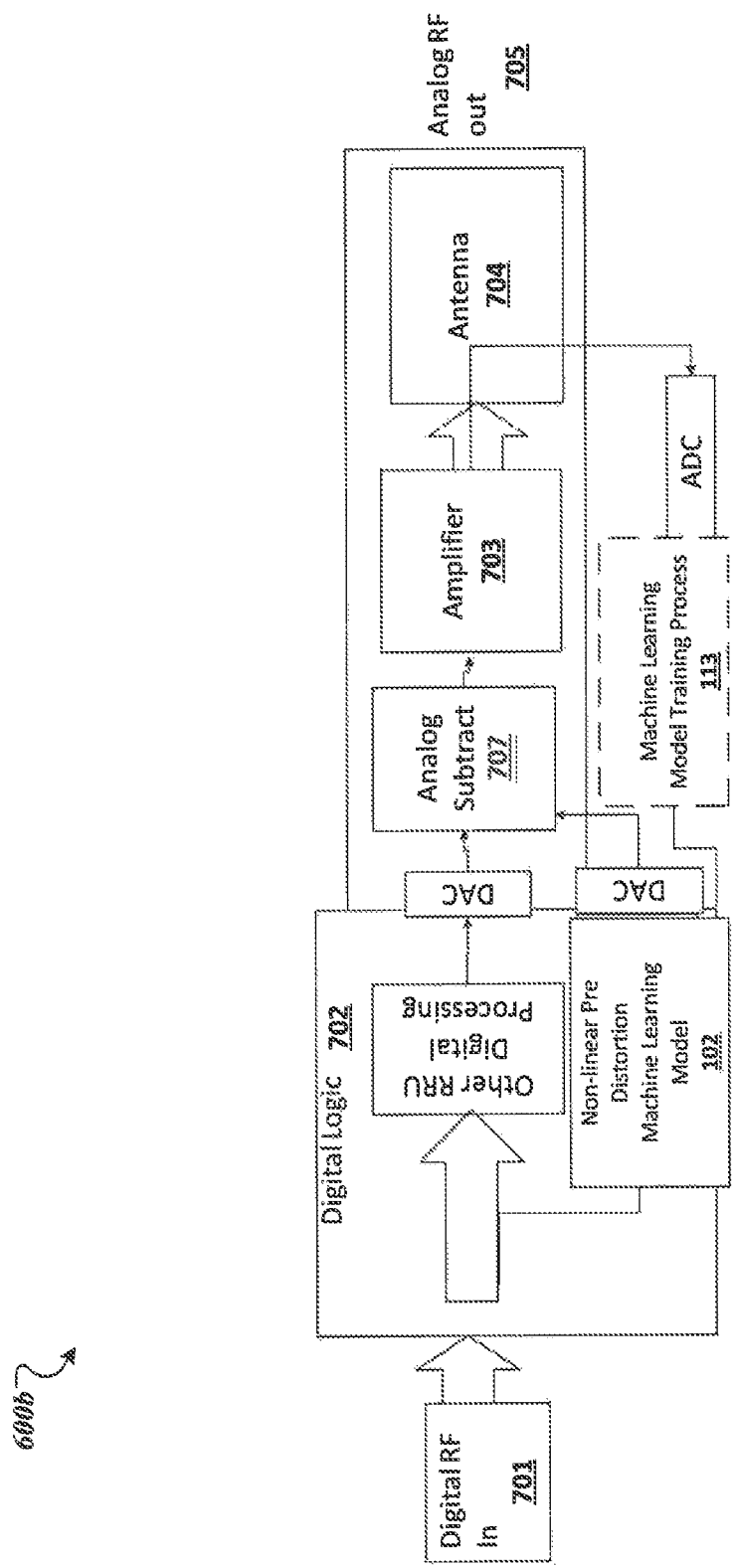
FIG. 7B illustrates an example configuration for fault-tolerant subtractive mode within the remote radio unit.

The nonlinear pre-distortion system 103 can be deployed in several different deployment configurations. For example, the nonlinear pre-distortion system 103 can be deployed within base stations, e.g., cellular, Wi-Fi, backhaul, or radio system. FIGS. 6A and 6B illustrate example configurations within tower-mounted amplifiers of a base station. FIG. 6A illustrates an example configuration for in-line mode within a tower-mounted amplifier, placing a nonlinear pre-distortion system 103 between an input 601 and an amplifier 603. FIG. 6B illustrates an example configuration for fault-tolerant subtractive mode within the tower-mounted amplifier, with the nonlinear pre-distortion system 103 configured between an RF splitter 606 and an analog subtract 607. FIGS. 7A and 7B illustrate example configurations within remote radio units of a base station. FIG. 7A illustrates a configuration for in-line mode within a remote radio unit, with the nonlinear pre-distortion system 103 configured between the input 701 and the amplifier 703. FIG. 7B illustrates an example configuration for fault-tolerant subtractive mode within the remote radio unit with the machine learning model 102 and the machine learning model training process 113 separated.

In one implementation, the nonlinear pre-distortion system 103 can be deployed inside a single chip of a radio frequency integrated circuit (RFIC) device, e.g., an AD9361 or a Qualcomm RTR chip and a baseband processor. In such deployments, the system 103 can reside on the radio system on a chip and/or the baseband processing system on a chip on a phone or other mobile device, e.g., laptop, tablet. The nonlinear pre-distortion model can exist either in the baseband processing system on a chip with off chip model parameter updates or in the radio system on a chip with off-chip model parameter updates (e.g. model parameter updates and tuning may occur at a slower rate, execute on a different processor, a remote location, or other configuration). In an alternative implementation, the nonlinear predistortion system 103 can be deployed completely within a single chip of a RFIC device.

Figure 8:
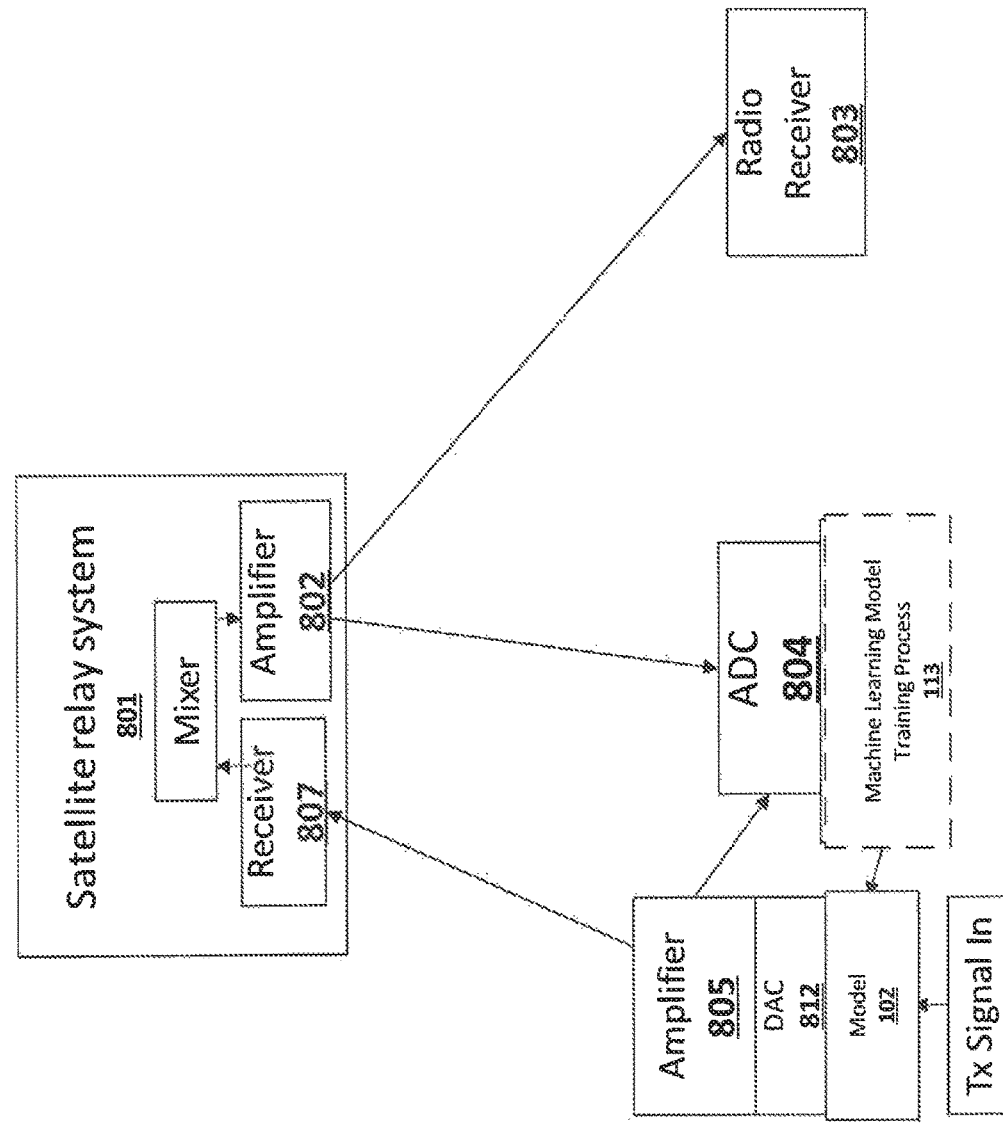
FIG. 8 illustrates an example configuration for a satellite relay system.

The nonlinear pre-distortion system 103 can be deployed in a backhaul or satellite relay radio system. FIG. 8 illustrates an example configuration 800 for a satellite relay system 801. The satellite relay system 801 includes an amplifier 802 that distorts signals. The configuration 800 may also include an amplifier 805 for transmission. One or more amplifiers' distortion effects may be taken into consideration when updating the machine learning model using the machine learning model training process 113.

Figure 9:
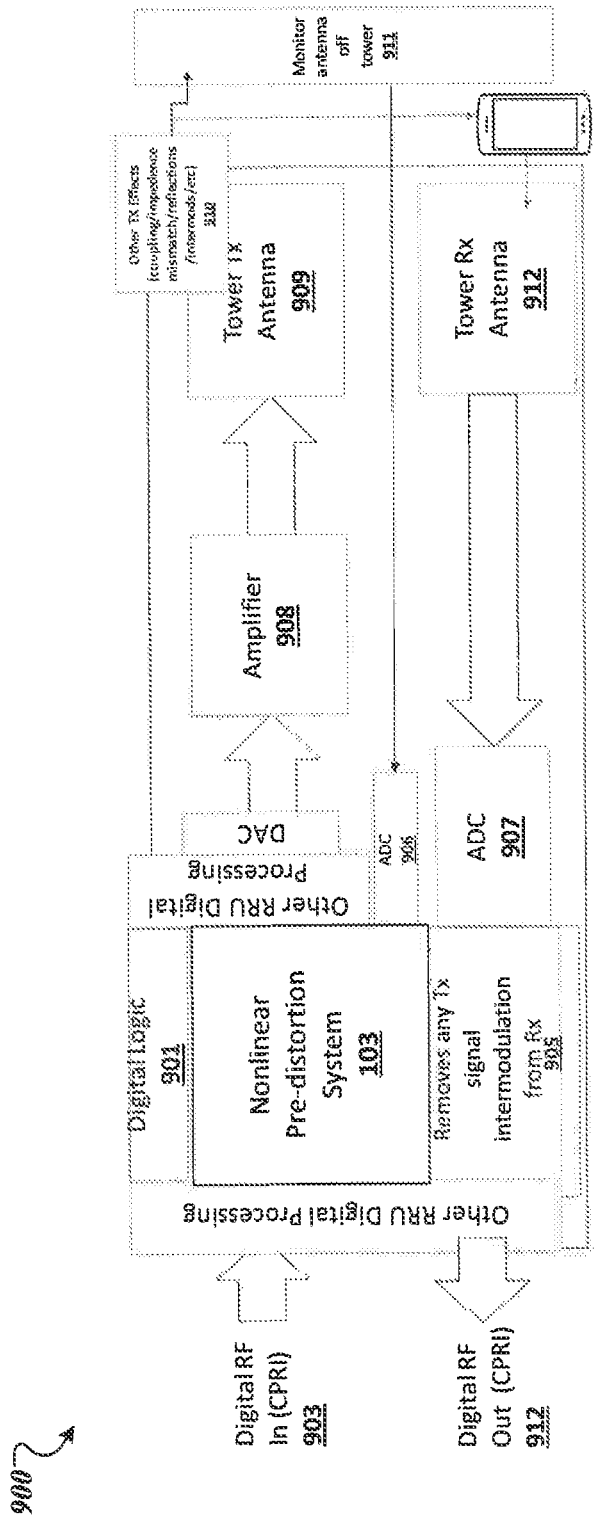
FIG. 9 illustrates an example configuration for a system that includes interference cancellation.

The nonlinear pre-distortion system 103 can additionally or alternatively be deployed in a system for interference cancellation. In this case, interference, for example from nearby emitters or sources of interference can be suppressed or removed from the received signal to allow for improved radio system performance. One source of such interference is two co-located base stations operating on frequencies whereby harmonics of the transmitted signals when mixed together by non-linear junctions, such can occur in rusty metals, produce interfering signals in the receive band of one base station in a process known as Passive Intermodulation (PIM) distortion. FIG. 9 illustrates an example configuration 900 for a system that includes interference cancellation. This configuration uses an equivalent network which modifies a received radio signal 912 and passes it through a distortion/interference removal network 905 in order to remove artifacts resulting from an interference source which may be sensed at another antenna 911. To accomplish this the network uses a similar distance metric to minimize or remove any dependent signal content from the interference signal 911 present within the received signal 912. In a pre-distortion on transmit system, a sensor such as 912 may be used after radio transmission to compensate additionally for impairments and distortion to the signal which occurs after transmission from the base station.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for correcting distortion of radio signals in a cellular communications system, the method comprising:
    obtaining, at a base station in the cellular communications system, a transmit radio signal that is prepared for transmitting to one or more radio receivers associated with the cellular communications system;
    accessing a nonlinear pre-distortion machine learning model associated with the base station, wherein the nonlinear pre-distortion machine learning model includes model parameters associated with values corresponding to one or more deployment scenarios in the cellular communications system, and at least one nonlinear function to correct radio signal distortion;
    generating a pre-distorted radio signal by processing the transmit radio signal using the nonlinear pre-distortion machine learning model;
    obtaining a transmit output radio signal by processing the pre-distorted radio signal through a transmitting radio signal processing stage of the base station; and
    transmitting the transmit output radio signal to the one or more radio receivers.

2. The method of claim 1, wherein the model parameters in the nonlinear pre-distortion machine learning model are loaded with values for a particular deployment scenario of the one or more deployment scenarios, and
    wherein generating the pre-distorted radio signal comprises generating the pre-distorted radio signal for the particular deployment scenario.

3. The method of claim 2, wherein the particular deployment scenario comprises one of:
    sending a radio transmission from the base station that includes the nonlinear pre-distortion machine learning model inside a tower mounted amplifier in an inline mode;
    sending a radio transmission from the base station that includes the nonlinear pre-distortion machine learning model inside a tower mounted amplifier in a fault-tolerant subtractive mode;
    sending a radio transmission from the base station that includes the nonlinear pre-distortion machine learning model inside a remote radio unit in an inline mode;
    sending a radio transmission from the base station that includes the nonlinear pre-distortion machine learning model inside a remote radio unit in a fault-tolerant subtractive mode; or
    sending a radio transmission to a system that includes interference cancellation.

4. The method of claim 2, further comprising:
    obtaining a received radio signal that corresponds to a representation of the transmit output radio signal received at the one or more radio receivers;
    determining a distance metric between the transmit radio signal and the received radio signal; and updating the values of the model parameters for the particular deployment scenario based at least on the distance metric.

5. The method of claim 4, wherein the distance metric is selected from one of: a mean squared error, an absolute error, or another quantitative measurement of an error value computed between the transmit radio signal and the received radio signal.

6. The method of claim 4, wherein updating the values of the model parameters includes using optimizers based on Stochastic Gradient Descent that iteratively minimize the distance metric based on an exact or approximate gradient of the distance metric with regard to the model parameters.

7. The method of claim 1, wherein the values associated with the model parameters are optimized to minimize the distortion or interference of radio signals associated with the base station in the cellular communications system.

8. The method of claim 1, wherein the nonlinear pre-distortion machine learning model is one of a deep neural network, a convolutional neural network, a recurrent neural network, or a combination of different types of neural networks.

9. An apparatus for correcting distortion of radio signals in a cellular communications system, the apparatus comprising:
  one or more processors associated with a base station in the cellular communications system; and
  one or more machine-readable media storing instructions that, when executed, are configured to cause the one or more processors to perform operations comprising:
    obtaining, at the base station, a transmit radio signal that is prepared for transmitting to one or more radio receivers associated with the cellular communications system;
    accessing a nonlinear pre-distortion machine learning model associated with the base station, wherein the nonlinear pre-distortion machine learning model includes model parameters associated with values corresponding to one or more deployment scenarios in the cellular communications system, and at least one nonlinear function to correct radio signal distortion;
    generating a pre-distorted radio signal by processing the transmit radio signal using the nonlinear pre-distortion machine learning model;
    obtaining a transmit output radio signal by processing the pre-distorted radio signal through a transmitting radio signal processing stage of the base station; and
    transmitting the transmit output radio signal to the one or more radio receivers.

10. The apparatus of claim 9, wherein the model parameters in the nonlinear pre-distortion machine learning model are loaded with values for a particular deployment scenario of the one or more deployment scenarios, and
  wherein generating the pre-distorted radio signal comprises generating the pre-distorted radio signal for the particular deployment scenario.

11. The apparatus of claim 10, wherein the particular deployment scenario comprises one of:
  sending a radio transmission from the base station that includes the nonlinear pre-distortion machine learning model inside a tower mounted amplifier in an inline mode;
  sending a radio transmission from the base station that includes the nonlinear pre-distortion machine learning model inside a tower mounted amplifier in a fault-tolerant subtractive mode;
  sending a radio transmission from the base station that includes the nonlinear pre-distortion machine learning model inside a remote radio unit in an inline mode;
  sending a radio transmission from the base station that includes the nonlinear pre-distortion machine learning model inside a remote radio unit in a fault-tolerant subtractive mode; or
  sending a radio transmission to a system that includes interference cancellation.

12. The apparatus of claim 10, wherein the operations further comprise:
  obtaining a received radio signal that corresponds to a representation of the transmit output radio signal received at the one or more radio receivers;
  determining a distance metric between the transmit radio signal and the received radio signal; and
  updating the values of the model parameters for the particular deployment scenario based at least on the distance metric.

13. The apparatus of claim 12, wherein the distance metric is selected from one of: a mean squared error, an absolute error, or another quantitative measurement of an error value computed between the transmit radio signal and the received radio signal.

14. The apparatus of claim 12, wherein updating the values of the model parameters includes using optimizers based on Stochastic Gradient Descent that iteratively minimize the distance metric based on an exact or approximate gradient of the distance metric with regard to the model parameters.

15. The apparatus of claim 9, wherein the values associated with the model parameters are optimized to minimize the distortion or interference of radio signals associated with the base station in the cellular communications system.

16. The apparatus of claim 9, wherein the nonlinear pre-distortion machine learning model is one of a deep neural network, a convolutional neural network, a recurrent neural network, or a combination of different types of neural networks.

17. One or more non-transitory machine-readable media storing instructions that, when executed, are configured to cause one or more processors to perform operations comprising:
  obtaining, at a base station in a cellular communications system, a transmit radio signal that is prepared for transmitting to one or more radio receivers associated with the cellular communications system;
  accessing a nonlinear pre-distortion machine learning model associated with the base station, wherein the nonlinear pre-distortion machine learning model includes model parameters associated with values corresponding to one or more deployment scenarios in the cellular communications system, and at least one nonlinear function to correct radio signal distortion;
  generating a pre-distorted radio signal by processing the transmit radio signal using the nonlinear pre-distortion machine learning model;
  obtaining a transmit output radio signal by processing the pre-distorted radio signal through a transmitting radio signal processing stage of the base station; and
  transmitting the transmit output radio signal to the one or more radio receivers.

18. The one or more non-transitory machine-readable media of claim 17, wherein the model parameters in the nonlinear pre-distortion machine learning model are loaded with values for a particular deployment scenario of the one or more deployment scenarios, and wherein generating the pre-distorted radio signal comprises generating the pre-distorted radio signal for the particular deployment scenario.

19. The one or more non-transitory machine-readable media of claim 18, wherein the particular deployment scenario comprises one of:

sending a radio transmission from the base station that includes the nonlinear pre-distortion machine learning model inside a tower mounted amplifier in an inline mode;

sending a radio transmission from the base station that includes the nonlinear pre-distortion machine learning model inside a tower mounted amplifier in a fault-tolerant subtractive mode;

sending a radio transmission from the base station that includes the nonlinear pre-distortion machine learning model inside a remote radio unit in an inline mode;

sending a radio transmission from the base station that includes the nonlinear pre-distortion machine learning model inside a remote radio unit in a fault-tolerant subtractive mode; or sending a radio transmission to a system that includes interference cancellation.

20. The one or more non-transitory machine-readable media of claim 18, wherein the operations further comprise:

obtaining a received radio signal that corresponds to a representation of the transmit output radio signal received at the one or more radio receivers;

determining a distance metric between the transmit radio signal and the received radio signal; and updating the values of the model parameters for the particular deployment scenario based at least on the distance metric.

21. The one or more non-transitory machine-readable media of claim 20, wherein the distance metric is selected from one of: a mean squared error, an absolute error, or another quantitative measurement of an error value computed between the transmit radio signal and the received radio signal.

22. The one or more non-transitory machine-readable media of claim 20, wherein updating the values of the model parameters includes using optimizers based on Stochastic Gradient Descent that iteratively minimize the distance metric based on an exact or approximate gradient of the distance metric with regard to the model parameters.

23. The one or more non-transitory machine-readable media of claim 17, wherein the values associated with the model parameters are optimized to minimize the distortion or interference of radio signals associated with the base station in the cellular communications system.

24. The one or more non-transitory machine-readable media of claim 17, wherein the nonlinear pre-distortion machine learning model is one of a deep neural network, a convolutional neural network, a recurrent neural network, or a combination of different types of neural networks.

* * * * *